(12) United States Patent
Maruyama

(10) Patent No.: US 6,346,701 B1
(45) Date of Patent: Feb. 12, 2002

(54) PHOTODETECTION METHOD AND PHOTODETECTION DEVICE AND PHOTODETECTION/LIGHT EMISSION DEVICE

(75) Inventor: Tsukasa Maruyama, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 09/389,064

(22) Filed: Sep. 2, 1999

(30) Foreign Application Priority Data

Sep. 4, 1998 (JP) .......................................... 10-251264

(51) Int. Cl.[7] .............................. H01J 3/14; H01J 5/16; H01J 40/14
(52) U.S. Cl. ....................................... 250/216; 250/239
(58) Field of Search ................................. 250/216, 353, 250/239; 359/719, 708

(56) References Cited

U.S. PATENT DOCUMENTS

| | | | | |
|---|---|---|---|---|
| 2,612,817 A | * | 10/1952 | Willcox | 356/221 |
| 4,055,761 A | * | 10/1977 | Shimomura | 250/239 |
| 4,425,501 A | * | 1/1984 | Stauffer | 250/216 |
| 4,972,089 A | * | 11/1990 | Stevenson | 250/551 |
| 5,002,374 A | * | 3/1991 | Ishibai et al. | 350/432 |
| 5,444,236 A | * | 8/1995 | Ludington et al. | 250/208.1 |
| 5,623,143 A | * | 4/1997 | Takamatsu | 250/239 |
| 5,691,536 A | * | 11/1997 | Shimoyama et al. | 250/239 |

FOREIGN PATENT DOCUMENTS

| | | |
|---|---|---|
| JP | A2-8-330608 | 12/1996 |
| JP | B2-2651756 | 5/1997 |
| JP | Y2-2561800 | 10/1997 |

* cited by examiner

*Primary Examiner*—Seungsook Ham
*Assistant Examiner*—Eric Spears
(74) *Attorney, Agent, or Firm*—Oliff & Berridge, PLC

(57) ABSTRACT

A photodetection device 10 is provided wherein a condenser lens 12 is arranged in front of a photodetection element 11. This photodetection device is of high photodetection angular efficiency with a constant photodetection e.m.f. over a prescribed region, of high photodetection angular efficiency and does not pick up optical interference. By forming condenser lens 12 as a non-spherical lens that concentrates light onto a single point of convergence C without spherical aberration and moving the photodetection element 11 further towards lens 12 than the point of convergence C, it is arranged that light that has passed through condenser lens 12 is received over the entire region of the photodetection surface of photodetection element 11 and also that all of the light that is incident onto condenser lens 12 inclined at a prescribed angle is received by the photodetection surface.

14 Claims, 9 Drawing Sheets

COMPARATION BETWEEN PRACTICAL EXAMPLE AND PRIOR ART EXAMPLES

| | LENS DIAMETER | 95% PHOTODETECTION E.M.F. RANGE | 50% PHOTODETECTION E.M.F. RANGE | PHOTODETECTION ANGULAR EFFECIENCY | PHOTODETECTION E.M.F CURVE |
|---|---|---|---|---|---|
| PRACTICAL EXAMPLE | 3.4mm | ±24° | ±33° | 73% | FIG. 3(A) |
| | 8.9mm | ±30° | ±47° | 66% | FIG. 3(B) |
| PRIOR ART EXAMPLE | | ±14° | ±35° | 40% | FIG. 12(A) |
| | 3.25mm | ±23° | ±65° | 35% | FIG. 12(B) |

PHOTODETECTION METHOD AND PHOTODETECTION DEVICE AND PHOTODETECTION/LIGHT EMISSION DEVICE

BACKGROUND OF THE INVENTION

1. Field of the Invention

The present invention relates to a photodetection method and photodetection device and photodetection/light emission device that are utilized for example in a photodetection unit for optical communication using infra-red rays.

2. Description of the Related Art

Figure 11A:
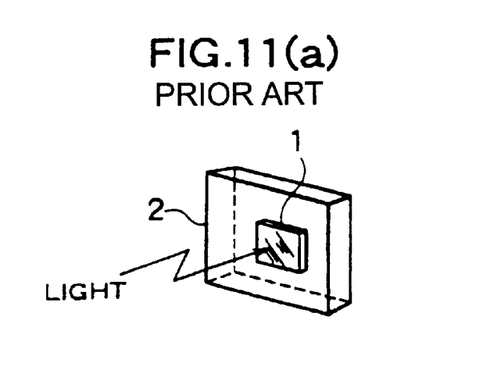

Photodetection devices of this type are provided at the fiber tip part in information communication devices using for example optical fibers and are constituted by a combination of a single lens and a photodetection element. A conventional known photodetection devices are illustrated in FIGS. 11(a), (b), (c), (d) and (e). In these Figures, 1 is a photodetection element, and 2 is a condenser lens arranged in front of it; condenser lens 2 is usually integrated with a photodetection element package (constituted by transparent resin in which a photodetection element 1 is molded).

Figures 11B, 11C, 11E:
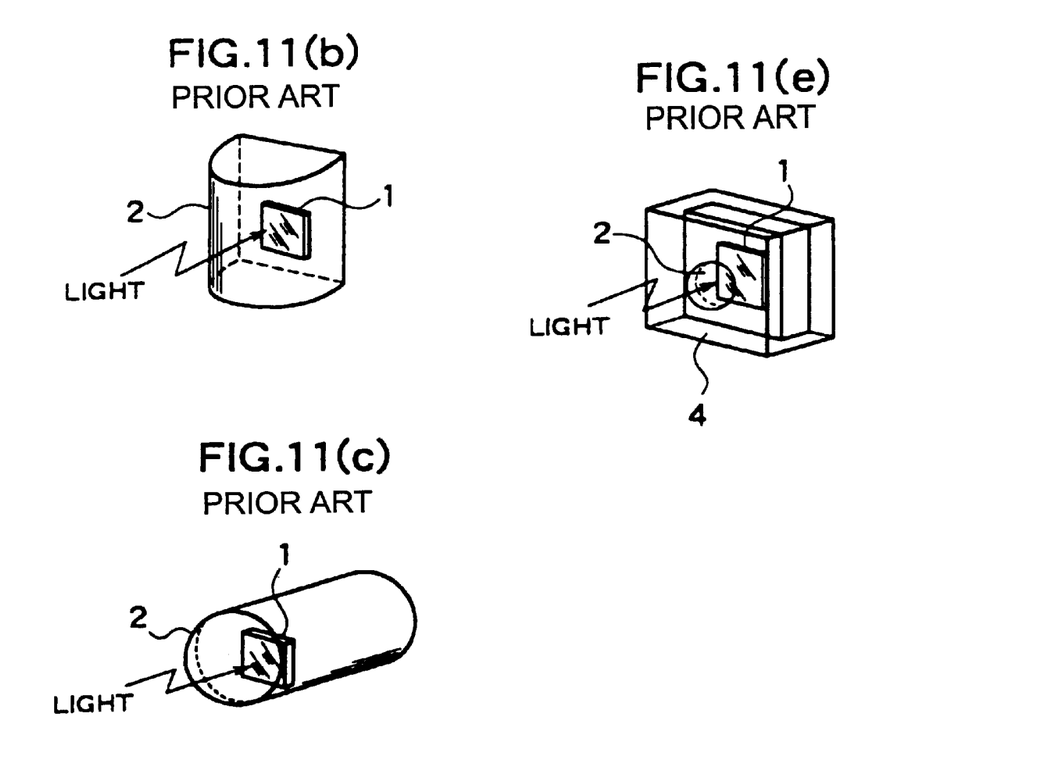

As shown in FIGS. 11(a), (b) and (c), the shape of the condenser lens may be flat, semi-cylindrical, or cylindrical but, if no modification is made to this, suffers from the defect that it easily admits external optical interference such as light from fluorescent lamps or incandescent lamps arriving at the optical input face and constitutes a source of photodetector noise, because of its wide half-value angle of about ±60°.

Figure 11D:
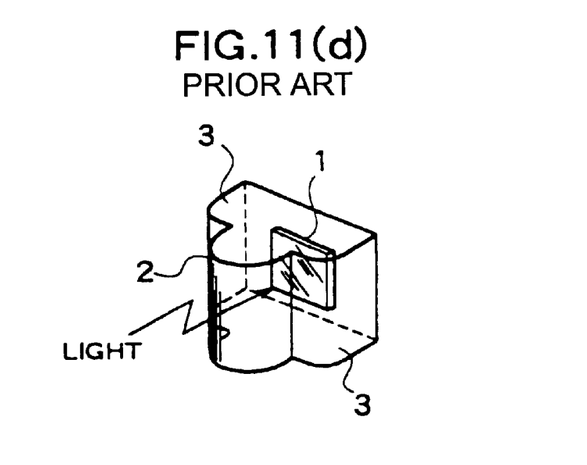

In order to deal with this drawback the following proposals have been made:

(1) to restrict the half-value angle to to ±30° or ±15° by suitably modifying the lens shape of the semi-cylindrical or hemispherical lens;

(2) as shown in FIG. 11(d), to provide an external interference exclusion section 3 connected to both sides or one side of semi-cylindrical condenser lens 2 (see Japanese Utility Model Number 2561800): or (3) as shown in FIG. 11(e), to cover the parts other than the central part of condenser lens 2 with a screening element 4 (Laid-open Japanese patent publication H. 8-330608, Japanese patent number 2651756).

However, the above proposals (1) to (3) had the following drawbacks.

Figure 12A:
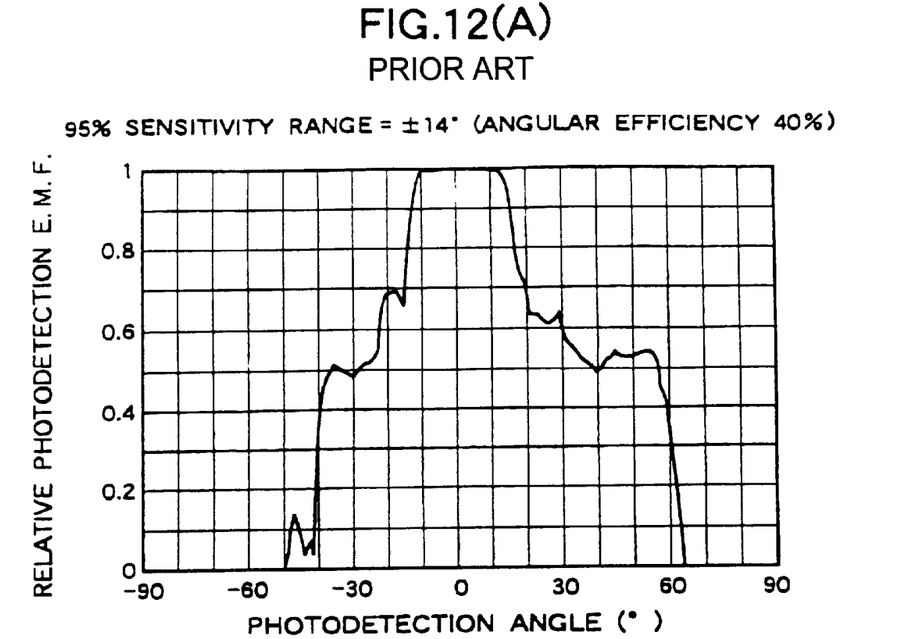
FIGS. 12(A) and (B) are views showing a photodetection e.m.f. curve according to a prior art example.
Figure 12B:
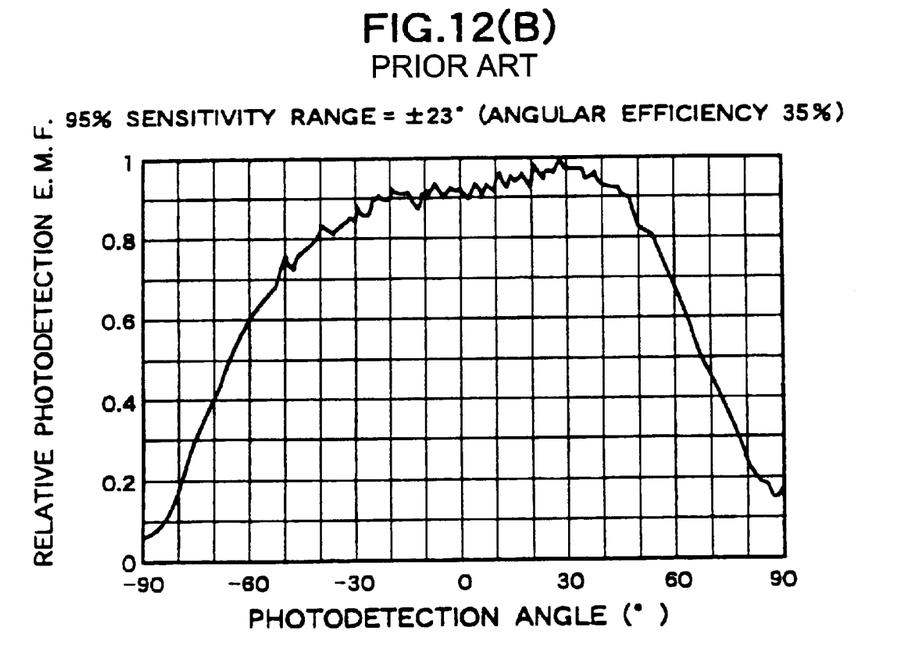

In the case of (1), since the photodetection e.m.f. is not fixed within the half-value angle, although there is a large photodetection e.m.f. in respect of light from directly in front, as the photodetection angle is increased, the photodetection e.m.f. gradually falls. Consequently, as shown in FIGS. 12(A) and (B), the photodetection angular efficiency is poor when it is below 50%. FIG. 12(A) shows characteristic in the case of suitably modifying the shape of the cylindrical lens shown in FIG. 11(c), and FIG. 12(B) shows characteristic in the case of suitably modifying the shape of the semi-cylindrical lens shown in FIG. 11(b).

In the case of (2), the presence of the interference exclusion section 3 renders the shape complicated and restricts the possibilities for miniaturization.

In the case of (3). Only a very small portion of the incoming light reaches photodetection element 1, so the photodetection e.m.f. is very weak. Also, since the screening effect in regard to interfering light that gets in from the apertures of screening element 4 is poor there is a limit to the extent to which the effect of optical interference can be excluded. Also, since a screening element must be provided separately from condenser lens 2, manufacturing costs are high.

Further, in the cases of (2) and (3), the designs are such that incoming light from directly in front converges onto the photodetection surface of photodetection element 1 so when the optical intensity arriving at this point is high there is a risk of the output of this point of convergence becoming saturated. Also, since the output of the areas to which convergence does not take placed is normally practically zero, if the angle of photodetection changes, causing the point of convergence to shift, the reaction time is prolonged, with the risk that response to signal changes may be delayed. Furthermore, since the photodetection e.m.f. is unstable at angles where the light is converging onto a contaminated or defective portion of photodetection element 1, the output tends to be easily affected by photodetection angle. Also, since photodetection element 1 is arranged at the position of the focal point, a large distance is required between the surface of condenser lens 2 and photodetection element 1, which limits possibilities for miniaturizing the device.

SUMMARY OF THE INVENTION

In view of the foregoing, an object of the present invention is to provide a photodetection method and photodetection device and photodetection/light emission device wherein there is no possibility of optical interference being picked up, which has a stable photodetection e.m.f. in a prescribed region, and which has high photodetection angular efficiency.

The following are means for resolving the above-mentioned issues.

A first aspect of the present invention is a method of photodetection, wherein photodetection is performed with a condenser lens positioned in front of a photodetection element, in which: as said condenser lens, a non-spherical lens is employed that concentrates at a single point without spherical aberration light that is input from the optic axis direction of this lens; and by positioning said photodetection element such that the photodetection surface of said photodetection element is further towards the lens than the point of convergence of said condenser lens, it is arranged that light that has passed through said condenser lens is photodetected over most of the photodetection surface of said photodetection element and that said photodetection element is positioned in a position where it can photodetect all of light that is incident inclined at a prescribed angle with respect to the optic axis of said condenser lens.

A second aspect of the present invention is a photodetection device, wherein photodetection is performed with a condenser lens positioned in front of a photodetection element, in which: as said condenser lens, a non-spherical lens is employed that concentrates at a single point without spherical aberration light that is input from the optic axis direction of this lens; and by positioning said photodetection element such that the photodetection surface of said photodetection element is further towards the lens than the point of convergence of said condenser lens, it is arranged that light that has passed through said condenser lens is photodetected over most of the photodetection surface of said photodetection element and that said photodetection element is positioned in a position where it can photodetect all of light that is incident inclined at a prescribed angle with respect to the optic axis of said condenser lens.

A third aspect of the present invention is a is photodetection device, according to aspect 2, wherein said photodetection element is positioned in the position closest to said condenser lens in the range in which it can photodetect all of light incident at a prescribed angle with respect to said condenser lens.

A fourth aspect of the present invention is a photodetection device, according to aspect 2, wherein the shape of the curved surface of the non-spherical surface of said non-spherical lens is a shape expressed by the following expression:

$$f(x)=(1/R)\cdot[x^2/[1+\{1+A\cdot(x/R)^2\}^{1/2}]]+Bx^4+Cx^6+Dx^8+Ex^{10}$$

where R is the radius of curvature, x is the distance from the center of the lens, A, B, C, D and E are coefficients of the non-spherical surface, and f(x) is the lens shape when the distance is x.

A fifth aspect of the present invention is a photodetection device, according to aspect 4, wherein R=1.67793 and A=−0.66229.

A sixth aspect of the present invention is a Photodetection device, according to aspect 4, wherein R 1.72732 and A=−0.28636.

A seventh aspect of the present invention is a Photodetection device, according to aspect 2, wherein the 95% photodetection e.m.f. range is within ±30°, the 50% photodetection e.m.f. range is within ±47°, and the photodetection angular efficiency is 66% or better; where: the 95% photodetection e.m.f. range means the range of photodetection angle (angle made by the incident light with respect to the optic axis of the lens) for which the photodetection e.m.f. (magnitude of the voltage generated in the photodetection element by light that is incident onto the photodetection element) is 95% of the maximum value; the 50% photodetection e.m.f. range means the range of photodetection angle for which the photodetection e.m.f. is 50% of the maximum value; and the photodetection angular efficiency means the ratio of "range of 95% photodetection e.m.f."/"range of 50% photodetection e.m.f." expressed as a percentage value.

A eighth aspect of the present invention is a Photodetection device, according to aspect 2, wherein said photodetection element is packaged integrally with said condenser lens using the said material that constitutes said condenser lens.

A ninth aspect of the present invention is a photodetection device, according to aspect 8, wherein epoxy resin is employed as the material constituting said condenser lens.

A tenth aspect of the present invention is a photodetection device, according to aspect 8, wherein the surface roughness of the optical functioning surface of said condenser lens is below 1 micrometer in terns of arithmetical average roughness.

A eleventh aspect of the present invention is a photodetection device, according to aspect 8,wherein said photodetection element is mounted on a lead frame.

A twelfth aspect of the present invention is a photodetection device, according to aspect 11, wherein said lead frame is constituted of copper.

A thirteenth aspect of the present invention is a photodetection device, according to aspect 11, wherein said lead frame is of a construction capable of being mounted on a circuit board.

A fourteenth aspect of the present invention is a photodetection/light emission device in which a light-emitting unit and photodetection unit are integrally mounted, a photodetection device according to aspect 2 being employed for said photodetection unit.

FIGS. 1(*a*) and (*b*) are cross-sectional views of an embodiment of the present invention, FIG. 1(*a*) being the case where the incoming light has an angle and FIG. 1(*b*) being the case where the incoming light does not have an angle;

FIGS. 2(*a*),(*b*) and (*c*) are views given in explanation of part of the procedure when designing a photodetection device according to an embodiment of the present invention, FIG. 2(*a*) being the case where the light passing through the lens does not converge at a single point, FIG. 2(*b*) being the case where the light passing through the lens does converge at a single point, and FIG. 2(*c*) being the case where the incoming light is inclined;

FIGS. 11(*a*),(*b*),(*c*),(*d*) and (*e*) are views illustrating examples of a prior art photodetection device.

EXPLANATION OF THE REFERENCE SYMABOLS

11 photodetection element
12 condenser lens
H light
C point of convergence.

DESCRIPTION OF THE PREFERRED EMBODIMENTS

Embodiments of the invention are described below with reference to the drawings.

Figure 1A:
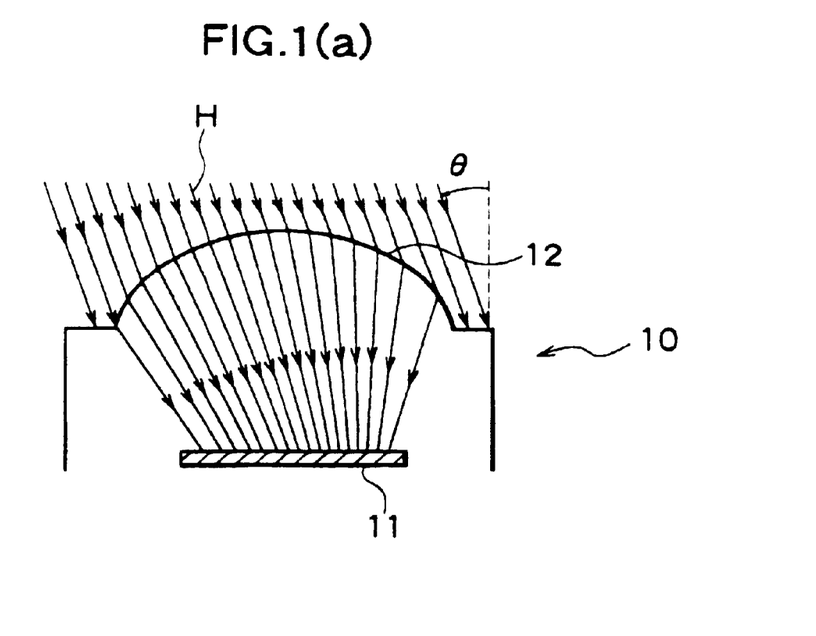
Figure 1B:
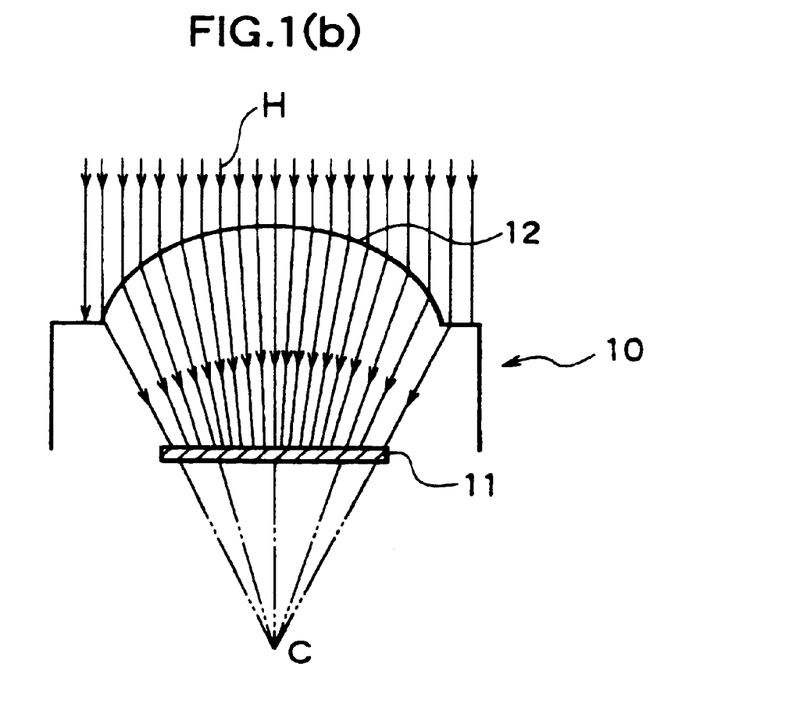

FIGS. 1(*a*) and (*b*) are cross-sectional views of a photodetection device 10 according to an embodiment. In this photodetection device 10, a condenser lens 12 formed integrally with a package is arranged in front of a photodetection element 11. Condenser lens 12 is formed as a non-spherical lens that condenses light to a single convergence point C without any spherical aberration. Also, photodetection element 11 is arranged so as to be moved further towards lens 12 than convergence point C. In this way, as shown in FIG. 1(*b*), light H that has passed through condenser lens 12 is arranged to be received over the entire region of the photodetection surface of photodetection element 11. Also, as shown in FIG. 1(*a*), light H that is incident onto condenser lens 12 inclined with a prescribed angle θ can all be detected at the photodetection surface of photodetection element 11 without leakage.

Design of this photodetection device 10 is performed by the following procedure.

Figure 2A:
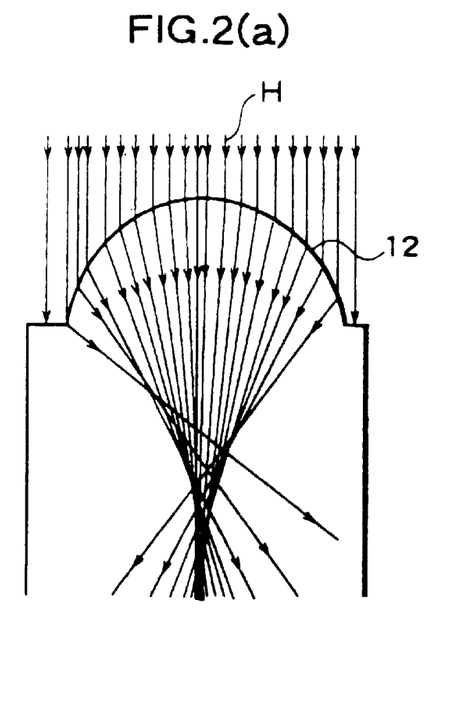

As shown in FIG. 2(*a*), when light H is incident parallel with the optical axis, if the condenser lens 12 is semi-cylindrical or hemispherical, the incoming light H cannot be made to converge at a point, because of the aberration which is characteristic of a lens having a spherical surface. Accordingly, firstly, the coefficients R and A of the following expression (1) are determined such that the incoming light is made to converge at a point on the set maximum diameter of lens 12. The shape of lens 12 is in accordance with expression (1). Specifically, in expression (1), R is the radius of curvature, x is the distance from the center of the lens, A, B, C, D and E are coefficients of the non-spherical surface, and f(x) is the lens shape at distance x. Specifically, in order to simplify processing, the second-order coefficients of expression (1) may be neglected by setting coefficients B, C, D and E to zero.

[Math expression 1]

$$f(x) = \frac{1}{R} \cdot \frac{x^2}{1 + \sqrt{1 + A\left(\frac{x}{R}\right)^2}} + Bx^4 + Cx^6 + Dx^8 + Ex^{10} \quad (1)$$

(where R is the radius of curvature, x is the distance from the center of the lens, A, B, C, D and E are coefficients of the non-spherical surface, and f(x) is the lens shape at distance x.)

Figure 2B:
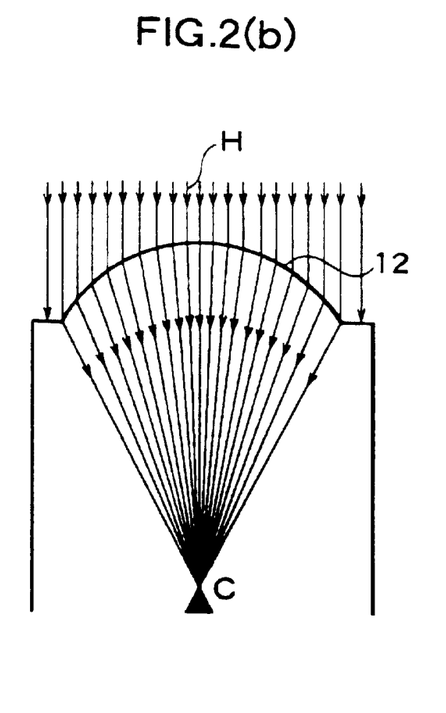
Figure 2C:
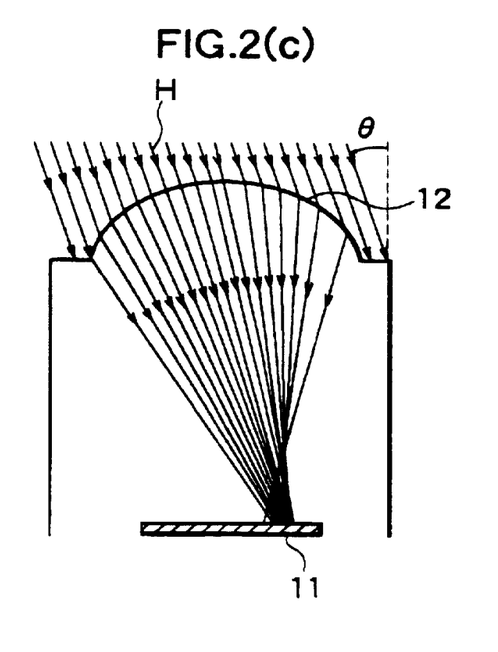

When the lens shape is found in accordance with expression (1), as shown in FIG. 2(b), light H incident onto the condenser lens 12 is made to converge at a single point of convergence C. Next, as shown in FIG. 2(c), the incident light H is inclined by an angle e constituting the limit for which photodetection is desired to be performed. Next, as shown in FIG. 1(a), photodetection element 11 is brought as close a possible to condenser lens 12, into a position such that no rays of light can escape. When this is done, as shown in FIG. 1(b), the light H that arrives at photodetection element 11 after passing through condenser lens 12 is uniformly distributed-over a wide range instead of being concentrated at a single point on photodetection element 11, even though it is incident at ±θ°. In this way photodetection element 10 can be obtained.

Figure 3A:
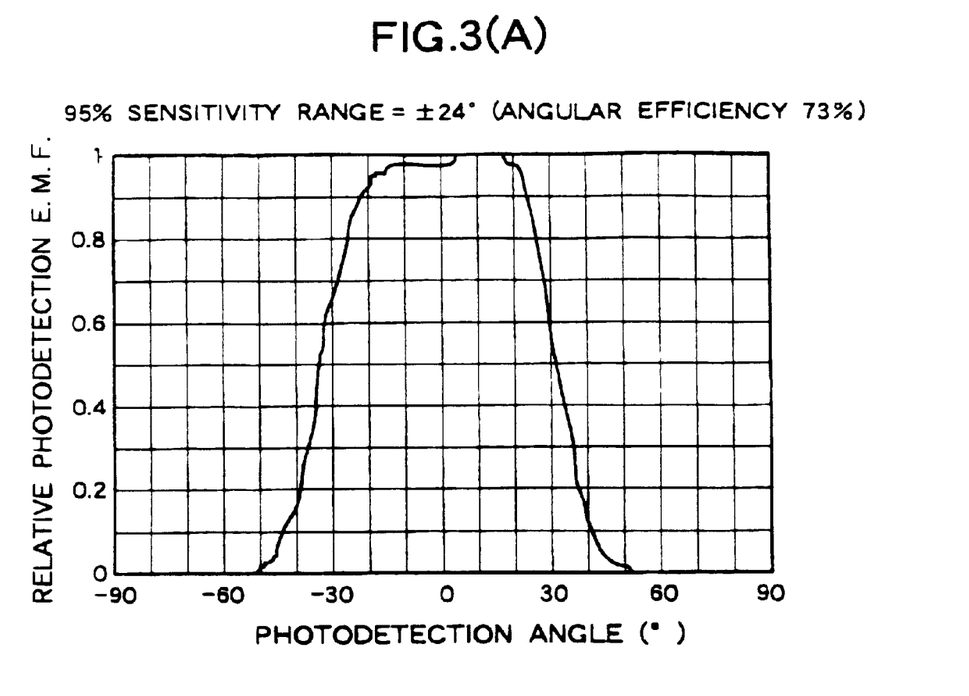
FIGS. 3(A) and (B) are views showing a photodetection e.m.f. curve according to an embodiment of the present invention.
Figure 3B:
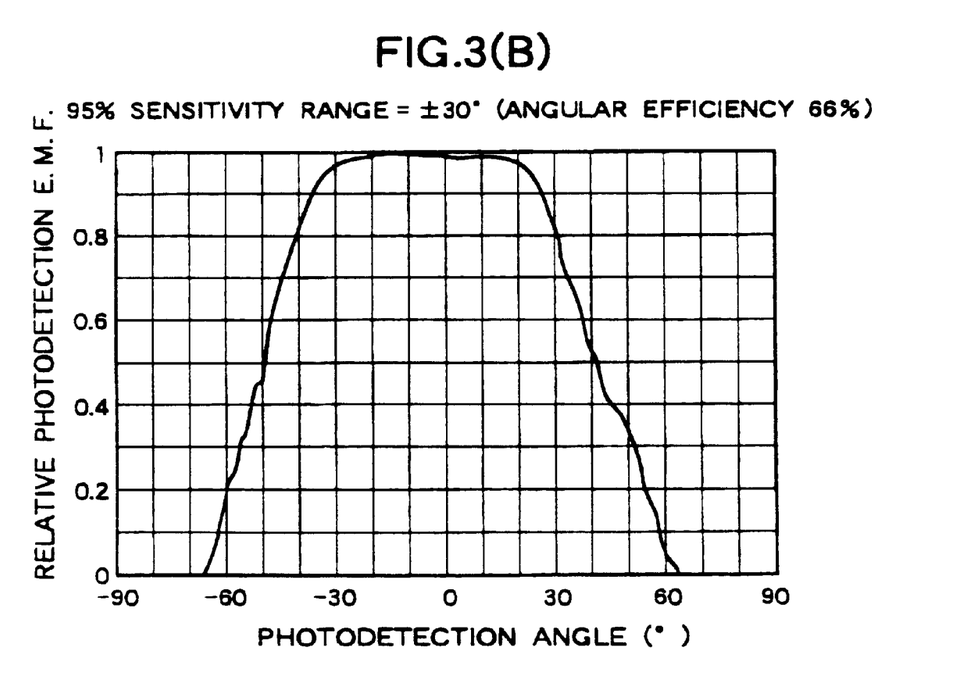
Figure 4:
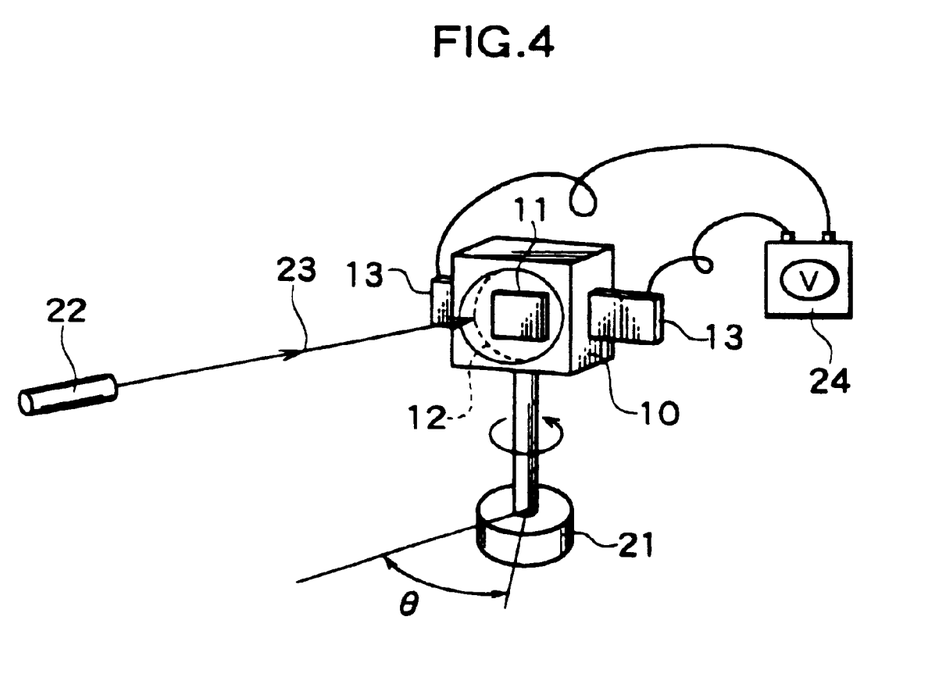
FIG. 4 is a view given in explanation of a method of measurement for obtaining a photodetection e.m.f. curve.

FIG. 3 shows two examples of relative photodetection e.m.f. curves of photodetection device 10 according to the embodiment. The determination of the e.m.f. curves was performed as shown in FIG. 4. Specifically. semiconductor laser light 23 from laser light source 22 of wavelength 670 mm focused to a minute spot is directed from the front of condenser lens 12 onto photodetection device 10 mounted on a rotary base 21 and the voltage at the terminals 13 at both ends of photodetection element 11 is measured by voltmeter 24 whilst rotating photodetection device 10. The relative photodetection e.m.f. curves of FIG. 3 were obtained taking the angle of the incoming light at condenser lens 12 along the horizontal axis and the relative photodetection e.m.f. obtained by dividing the measured e.m.f. by the maximum e.m.f. along the vertical axis.

The photodetection elements used in the two practical examples of measurement were specifically constructed as follows.

They had in common that: the condenser lens 12 was made of epoxy resin of refractive index 1.55 after curing which also served as a package for holding photodetection element 11; the arithmetical average roughness of the surface of the condenser lens 12 was made under 1 μm; as photodetection element 11 a silicon element of 2.4 mm square, thickness 0.3 mm was employed; the maximum diameter of condenser lens 12 was small at 3.4 mm, the distance between the tip of condenser lens 12 and the surface of photodetection element 11 was 2.4 mm; photodetection element 11 was mounted using silver paste onto a copper lead frame of thickness 0.15 mm whose surface had been subjected to silver plating treatment; and photodetection element 11 was wired with gold wire of 0.03 mm diameter. Their individual details were as follows:

PRACTICAL EXAMPLE 1

A condenser lens 12 was manufactured with coefficient R=1.67793, coefficient A=0.66229 when receiving infra-red rays with photodetection e.m.f. of 95% or more in the range of ±24°. The results of measuring the photodetection e.m.f. curve of the photodetection device 10 that was thus manufactured were as shown in FIG. 3(A). Excellent results were obtained, the range of 95% photodetection e.m.f. in which the photodetection e.m.f. could be considered flat being ±24° and the photodetection angular efficiency being 73%.

PRACTICAL EXAMPLE 2

A condenser lens 12 was manufactured with coefficient R=1.72732, coefficient A=0.28636 when receiving infra-red rays with photodetection e.m.f. of 95% or more in the range of ±30°. The results of measuring the photodetection e.m.f. curve of the photodetection device 10 that was thus manufactured were as shown in FIG. 3(B). Excellent results were obtained, the range of 95% photodetection e.m.f. in which the photodetection e.m.f. could be considered flat being ±30° and the photodetection angular efficiency being 66%.

These results may be compared with the curves of the conventional examples of FIGS. 12(A) and (B).

In the case of FIG. 12(A), the 95% photodetection e.m.f. range is narrow at ±14° but since the interference to the photodetection e.m.f. is large. it is easily affected by interfering light entering from angles of ±40° or above. As a result, the photodetection angular efficiency is poor, at 40%. Also, in the case of FIG. 12(B), although the range of 95% photodetection e.m.f. is ±23° the curve shows a gentle slope, so externally interfering light can easily be picked up. Consequently the photodetection angular efficiency is poor at 35%.

Figure 5:
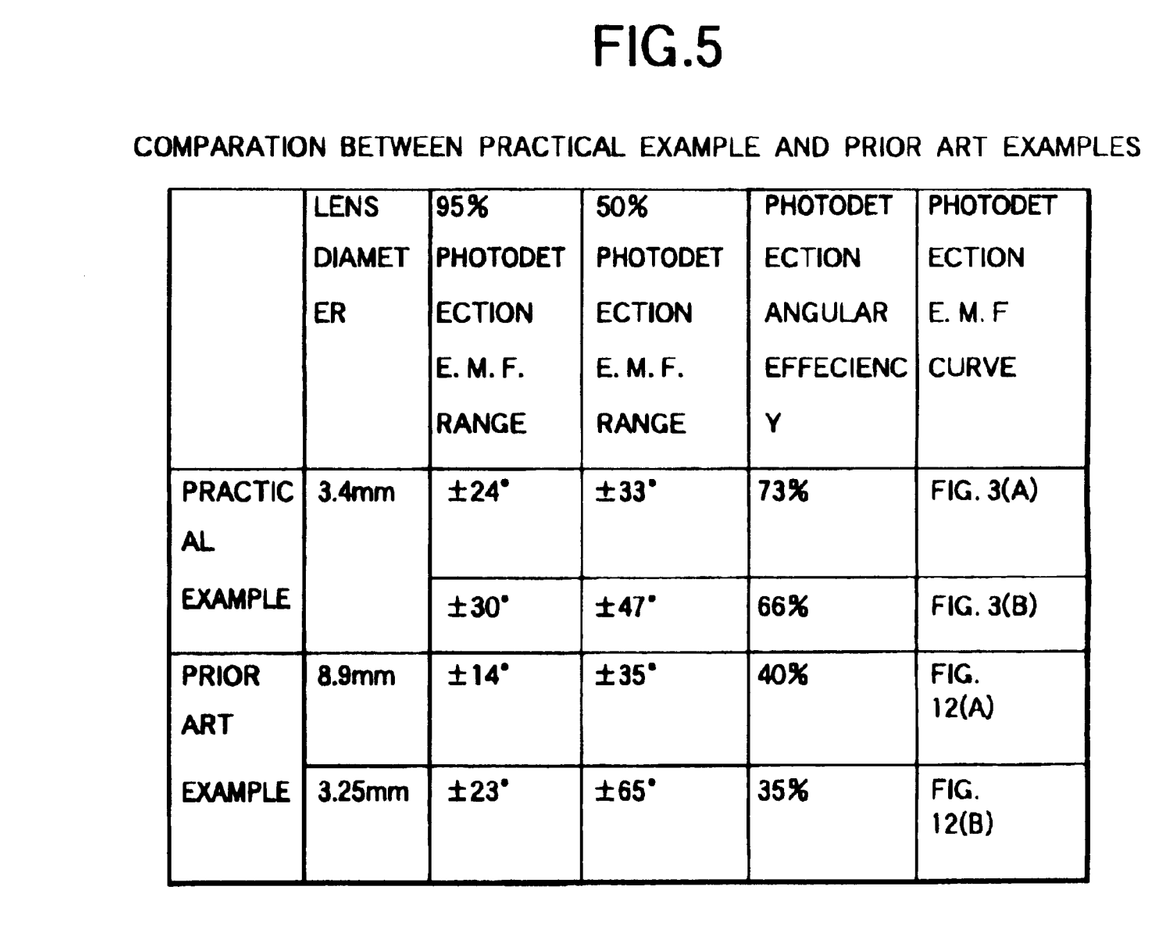
FIG. 5 is a view illustrating a comparison of an embodiment of the present invention with a prior art example.

A comparison of the Practical Examples of the present invention with the prior art examples is shown in FIG. 5.

Specifically, in the present invention, wide-angle photodetection e.m.f., which is caused by entry of interfering light, is extremely reduced, conferring the desired strong directionality in the prescribed angular range. As a result, excellent results in terms of photodetection angular efficiency of 73% and 66% for 95% photodetection e.m.f. ranges of ±24° and ±30° respectively were obtained.

A brief description is given below using FIG. 6 to FIG. 10 of some examples of photodetection devices of different appearance.

Figure 6:
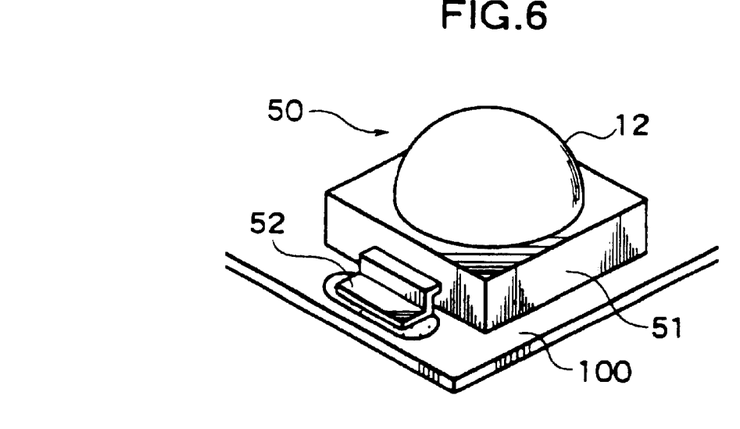
FIG. 6 is a view illustrating a first specific example of the appearance of a photodetection device.

In the photodetection device 50 shown in FIG. 6, lead frames 52 of Z-shaped cross-section extend from both ends of a photodetection element package 51 which is integral with condenser lens 12 so that photodetection device 50 can be soldered onto a circuit board 100 by means of these lead frames 52.

Figure 7:
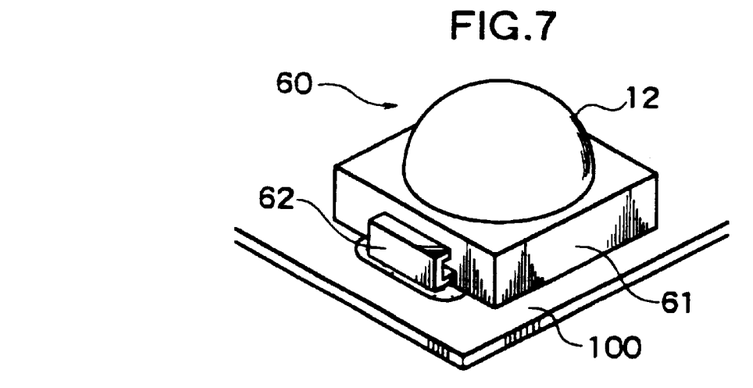
FIG. 7 is a view illustrating a second specific example of the appearance of a photodetection device.

In the photodetection device 60 shown in FIG. 7, lead frames 62 of U-shaped cross-section project at both ends of a photodetection element package 61 which is integral with condenser lens 12 so that photodetection device 60 can be soldered onto a circuit board 100 by means of these lead frames 62.

Figure 8:
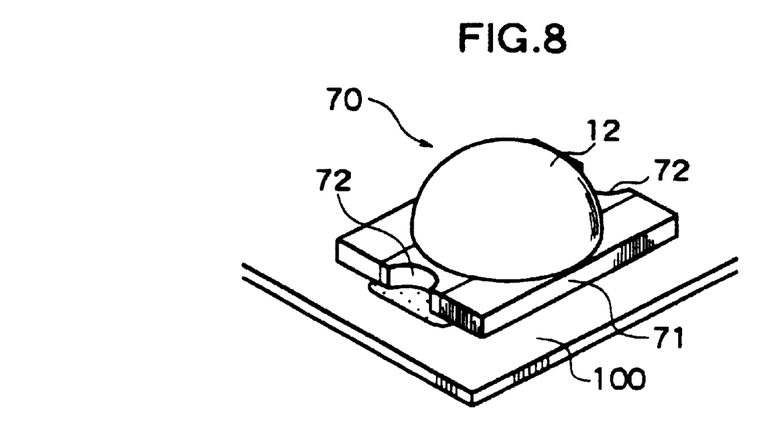
FIG. 8 is a view illustrating a third specific example of the appearance of a photodetection device.

In the photodetection device 70 shown in FIG. 8, through-hole terminals 72 are provided at both ends of a photodetection element package 71 which is integral with condenser lens 12 so that photodetection device 70 can be soldered onto a circuit board 100 by means of these through-hole terminals 72.

Figure 9:
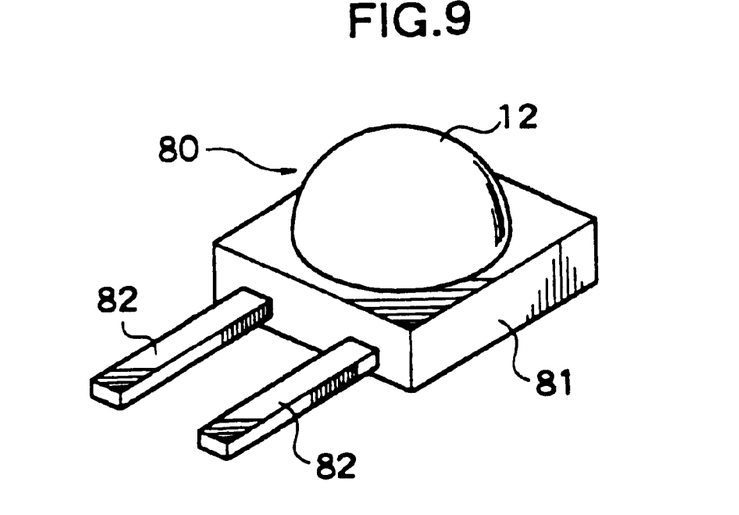
FIG. 9 is a view illustrating a fourth specific example of the appearance of a photodetection device.

In the photodetection device 80 shown in FIG. 9, two lead frames 82 are provided in parallel at one end of a photodetection element package 81 which is integral with condenser lens 12 so that photodetection device 80 can be soldered onto a circuit board 100 by means of these lead frames 82.

Figure 10:
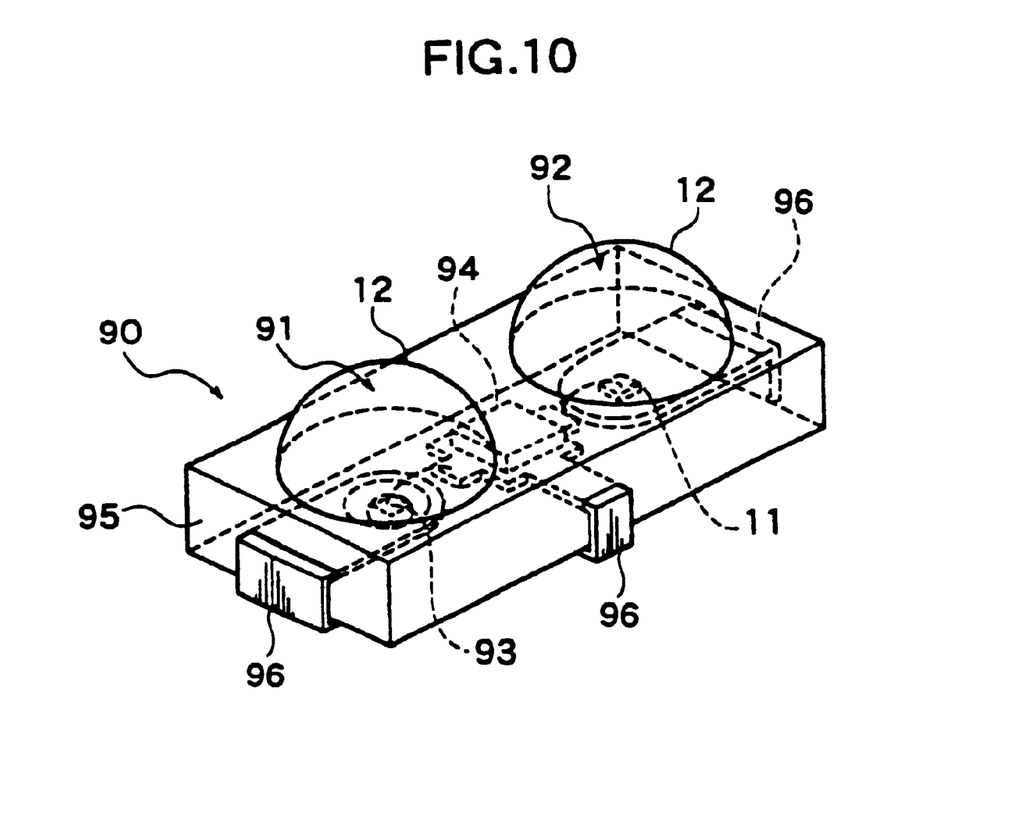
FIG. 10 is a view illustrating a fifth specific example of the appearance of a photodatection device.

In the photodetection device 90 shown in FIG. 10, a light-emitting unit 91 and photodetection unit 92 are integrally packaged, 11 is a photodetection element, 93 is a light-emitting element, and 94 is a drive circuit; lead frames 96 are provided at three side faces of package 95 having an integral condenser lens 12, so that photodetection device 90 can be soldered onto a circuit board by means of these lead frames 96.

As described above, the following benefits are provided by the present invention.

(1) Since it is arranged that a strong photodetection e.m.f. is only generated within the prescribed photodetection angular range, even-though neither an optical interference exclusion section nor screening element, which are of complicated construction, are mounted thereon, a photodetection device can be produced of a construction that does not permit entry of optical interference and manufacturing costs can be lowered thanks to an uncomplicated construction.

(2) The photodetection e.m.f. can be made practically constant over a prescribed photodetection angular range, thereby enabling the photodetection angular efficiency to be raised. Consequently, photodetection even of low light levels can be achieved.

(3) Since the light is evenly distributed over the photodetection element instead of being concentrated, its output is not saturated even at high optical intensities.

(4) Since the light is evenly distributed over the photodetection element instead of being concentrated, even if crystal defects or contaminated portions are present in the photodetection element, their effect on the photodetection angle of the photodetection e.m.f. can be made small.

(5) Since light in a prescribed angular range is arranged always to strike the entire photodetection element, a rapid response to changes in the direction of progression of the light can be achieved.

(6) Since the photodetection element is made to closely approach the direction of the lens, the depth of the photodetection element is small, enabling the device to be miniaturized.

(7) Using the condenser lens included in the present invention, if a photodetection element, light-emitting element and their drive circuits etc. are resin-molded, a kind of integrated circuit device is produced and there is the benefit that a compact photodetection/light-emitting device is obtained wherein reception and light emission can be achieved with a single device.

What is claimed is:

1. A method of photodetection utilizing a condenser lens positioned in front of a photodetection element, comprising the steps of:

utilizing, as said condenser lens, a non-spherical lens that concentrates, at a single point without spherical aberration, light that is input from the optic axis direction of this lens; and positioning said photodetection element such that the photodetection surface of said photodetection element is disposed closer to the lens than the point of convergence of said condenser lens, such that light that has passed through said condenser lens is photodetected over a majority of the photodetection surface of said photodetection element and that said photodetection element is positioned in a position where the photodetection element can photodetect all of light that is incident inclined at a prescribed angle with respect to the optic axis of said condenser lens.

2. A photodetection device, comprising:

a photodetection element; and a non-spherical lens, disposed in front of the photodetection element and operating as a condenser lens, that concentrates, at a single point without spherical aberration, light that is input from the optic axis direction of this lens;

wherein said photodetection element is positioned such that the photodetection surface of said photodetection element is closer to the lens than the point of convergence of said condenser lens, such that light that has passed through said condenser lens is photodetected over a majority of the photodetection surface of said photodetection element and that said photodetection element is positioned in a position where the photodetection element can photodetect all of light that is incident inclined at a prescribed angle with respect to the optic axis of said condenser lens.

3. The photodetection device according to claim 2 wherein said photodetection element is positioned in the position closest to said condenser lens in the range in which it can photodetect all of light incident at a prescribed angle with respect to said condenser lens.

4. The photodetection device according to claim 2 wherein the shape of the curved surface of the non-spherical surface of said non-spherical lens is a shape expressed by the following expression:

$$f(x)=(1/R)\cdot[x^2/[1+\{1+A\cdot(x/R)^2\}^{1/2}]]+Bx^4+Cx^6+Dx^8+Ex^{10}$$

where R is the radius of curvature, x is the distance from the center of the lens, A, B, C, D and E are coefficients of the non-spherical surface, and f(x) is the lens shape when the distance is x.

5. The photodetection device according to claim 4 wherein R=1.67793 and A=−0.66229.

6. The photodetection device according to claim 4 wherein R=1.72732 and A=−0.28636.

7. The photodetection device according to claim 2 wherein the 95% photodetection e.m.f. range is within ±30° from 0°, the 50% photodetection e.m.f. range is within ±47° from 0°, and the photodetection angular efficiency is 66% or better;

where: the 95% photodetection e.m.f. range means the range of photodetection angle, which is the angle made by the incident light with respect to the optic axis of the lens, for which the photodetection e.m.f., which is magnitude of the voltage generated in the photodetection element by light that is incident onto the photodetection element, is 95% of the maximum value;

the 50% photodetection e.m.f range means the range of photodetection angle for which the photodetection e.m.f. is 50% of the maximum value; and the photodetection angular efficiency means the ratio of "range of 95% photodetection e.m.f."/"range of 50% photodetection e.m.f." expressed as a percentage value.

8. The photodetection device according to claim 2 wherein said photodetection element is packaged integrally with said condenser lens using material that constitutes said condenser lens.

9. The photodetection device according to claim 8 wherein epoxy resin is employed as the material constituting said condenser lens.

10. The photodetection device according to claim 8 wherein the surface roughness of a surface of said condenser lens that functions optically is below 1 micrometer in terms of arithmetical average roughness, such that the average variation in surface profile is less than 1 micrometer.

11. The photodetection device according to claim 8 wherein said photodetection element is mounted on a lead frame.

12. The photodetection device according to claim 11 wherein said lead frame is constituted of copper.

13. The photodetection device according to claim 11 wherein said lead frame is of a construction capable of being mounted on a circuit board.

14. A photodetection system, comprising:

the photodetection device according to claim 2; and a light-emitting unit integrally mounted to the photodetection device.

* * * * *